(12) United States Patent
Desai et al.

(10) Patent No.: US 6,937,513 B1
(45) Date of Patent: Aug. 30, 2005

(54) INTEGRATED NAND AND NOR-TYPE FLASH MEMORY DEVICE AND METHOD OF USING THE SAME

(75) Inventors: Geeta Desai, Saratoga, CA (US); Vijendra Kuroodi, Cupertino, CA (US); Remi Lenoir, Menlo Park, CA (US)

(73) Assignee: LSI Logic Corporation, Milpitas, CA (US)

(*) Notice: Subject to any disclaimer, the term of this patent is extended or adjusted under 35 U.S.C. 154(b) by 132 days.

(21) Appl. No.: 10/688,023

(22) Filed: Oct. 16, 2003

(51) Int. Cl.[7] .............................................. G11C 16/04

(52) U.S. Cl. .............................. 365/185.11; 365/185.17

(58) Field of Search ...................... 365/185.11, 185.17, 365/185.01, 185.33

(56) References Cited

U.S. PATENT DOCUMENTS

| | | | | |
|---|---|---|---|---|
| 6,124,729 | A | * | 9/2000 | Noble et al. .......... 257/E21.693 |
| 6,197,639 | B1 | | 3/2001 | Lee et al. |
| 6,259,118 | B1 | * | 7/2001 | Kadosh et al. ................ 257/67 |
| 6,370,062 | B2 | | 4/2002 | Choi |
| 6,549,461 | B2 | | 4/2003 | Park et al. |
| 6,570,213 | B1 | | 5/2003 | Wu |
| 6,654,595 | B1 | * | 11/2003 | Dexter ....................... 455/323 |

OTHER PUBLICATIONS

"Flash Decision"—Author(s)—John Edwards.
NAND Flash Applications Design Guide—Author(s)—Toshiba America Electronic Components, Inc.

* cited by examiner

Primary Examiner—Thong Q. Le
(74) Attorney, Agent, or Firm—Conley Rose, P.C.

(57) ABSTRACT

A semiconductor memory device is provided as well as a method for operating the semiconductor memory device. The memory device includes a NOR array of memory cells and a NAND array of memory cells configured on the same monolithic semiconductor substrate. Each cell of the NOR array involves a single transistor, similar to each cell of the NAND array. The memory device is, therefore, an integrated circuit that includes not only the NOR and NAND arrays, but also the row and column decoders corresponding to each array. Furthermore, the integrated circuit includes the interface circuitry needed to transfer information as pages into and from the NAND array. The corresponding interface or controller is implemented on the same monolithic substrate as both the NAND array and the NOR array. Addresses targeted for the NOR array are sent as fully memory-mapped data into the NOR array, whereas addresses targeted for the NAND array are sent through the controller integrated within the semiconductor memory device. The single transistor cell of both the NAND array and NOR array preferably involves a flash EEPROM-type transistor that implements a floating gate dielectrically spaced between a control gate and the semiconductor substrate.

20 Claims, 3 Drawing Sheets

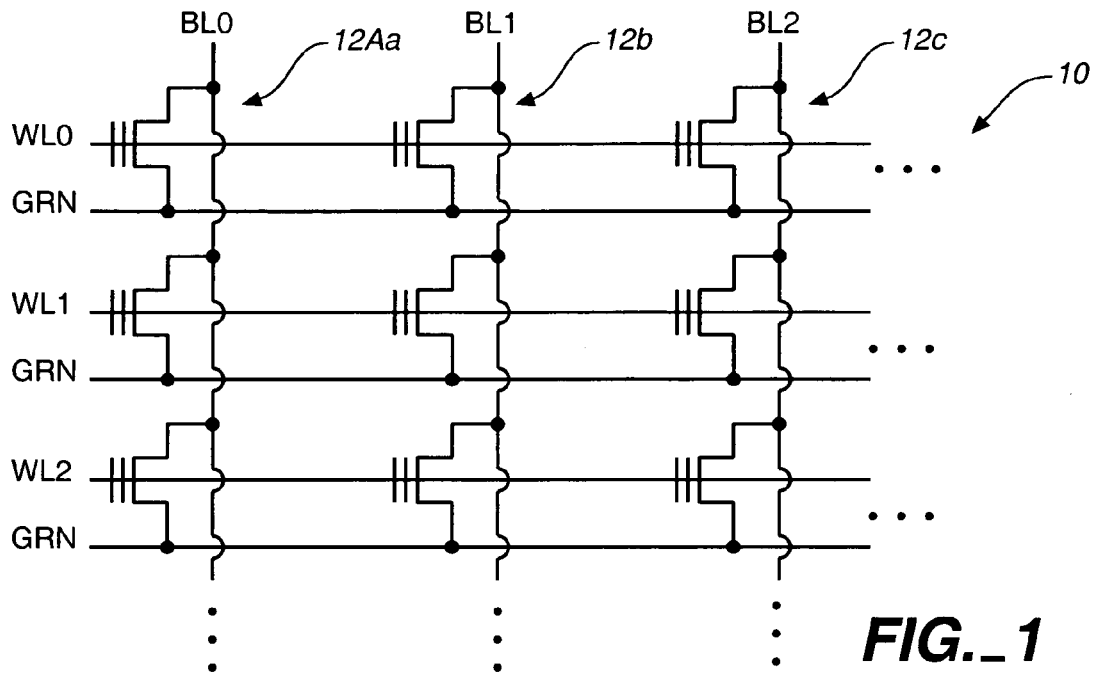
FIG._1
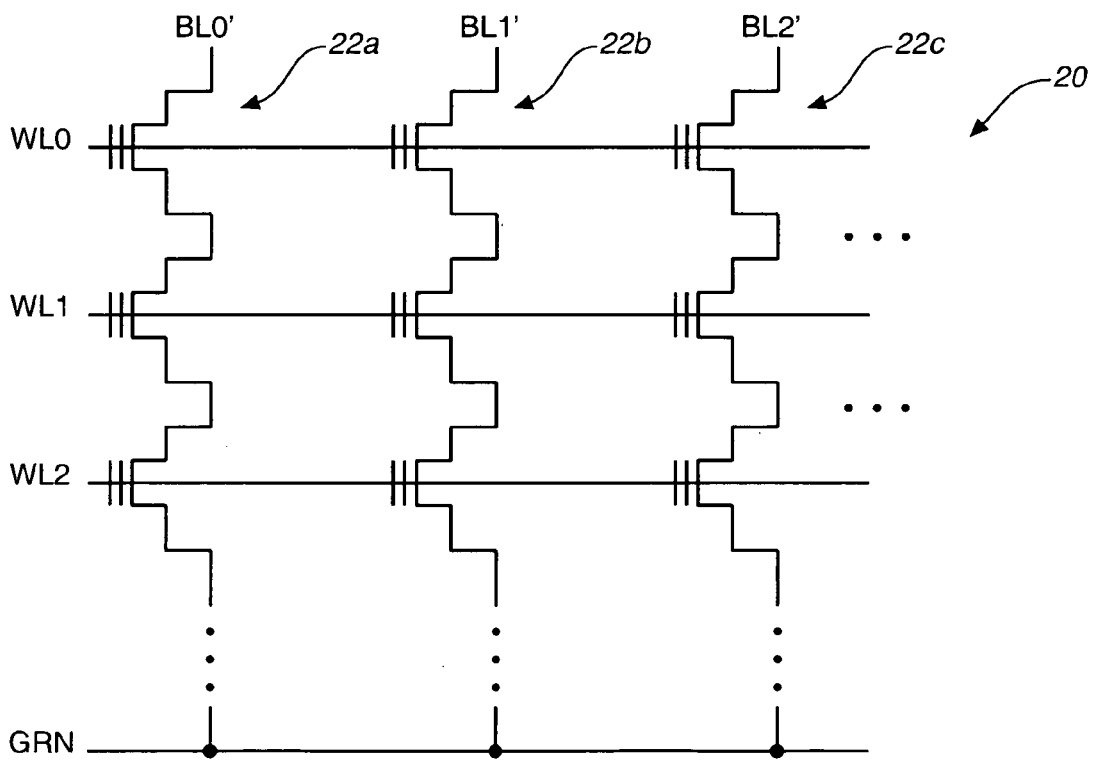
FIG._2

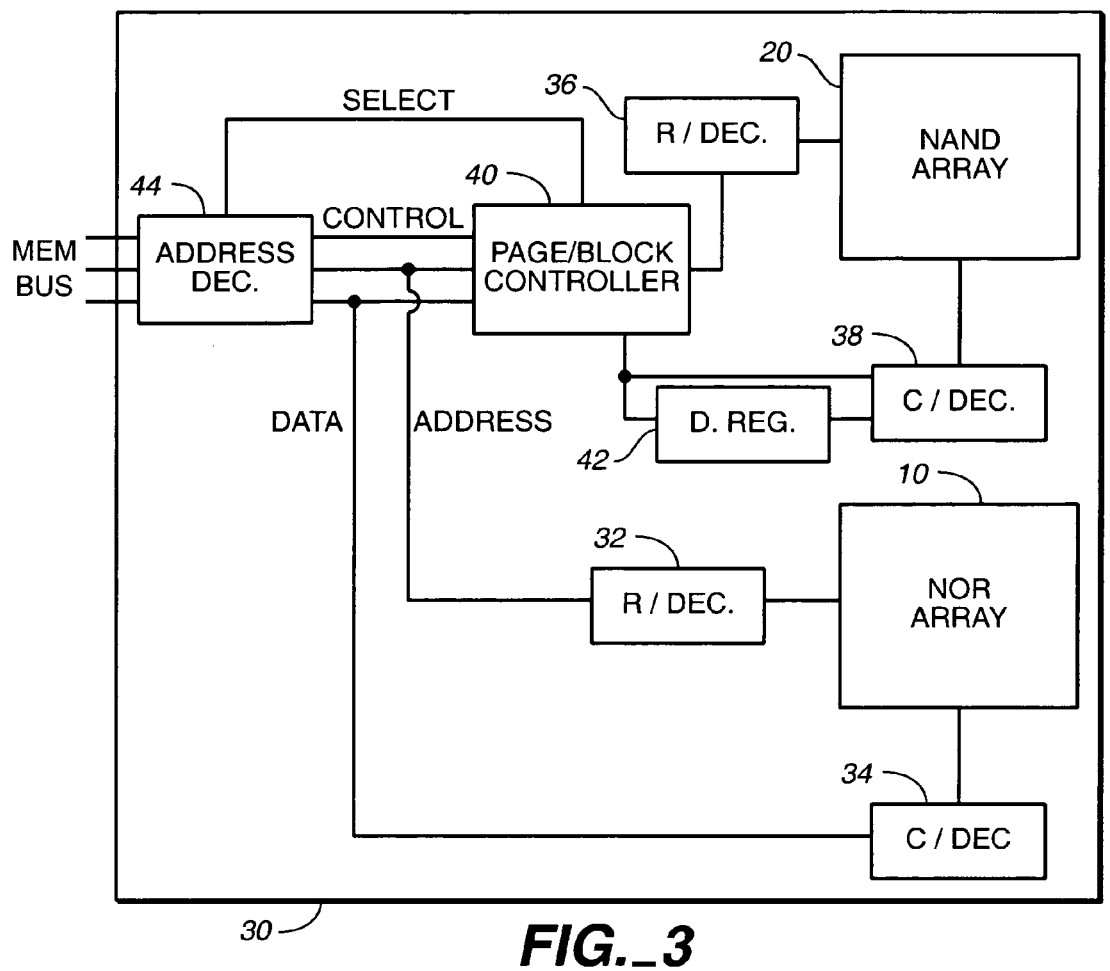
FIG._3

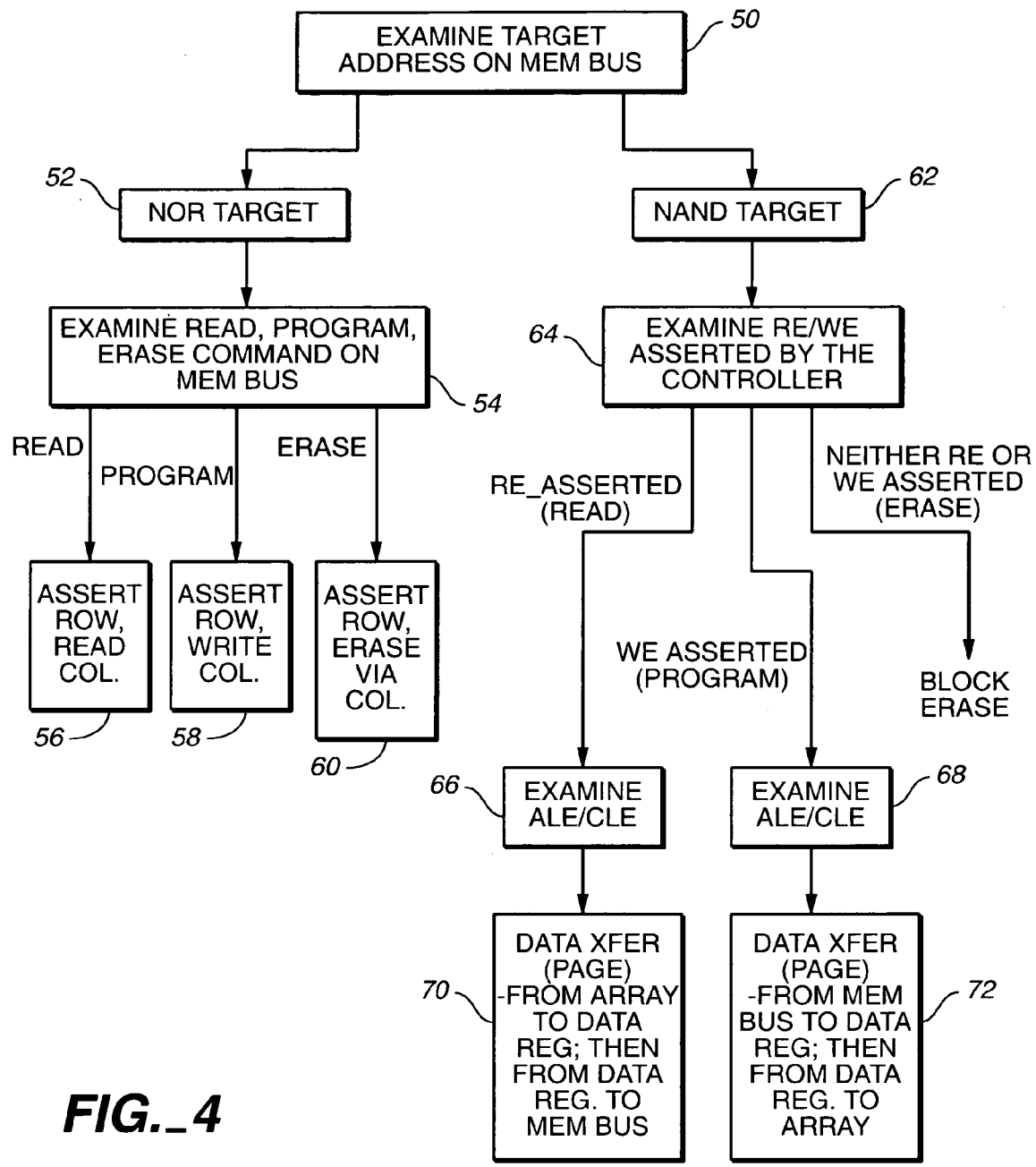
FIG._4

INTEGRATED NAND AND NOR-TYPE FLASH MEMORY DEVICE AND METHOD OF USING THE SAME

BACKGROUND OF THE INVENTION

1. Field of Invention

This invention relates to semiconductor memory and, more particularly, to a NOR array and a NAND array of electrically programmable memory cells that are flash erasable, wherein both the NOR and NAND arrays are integrated upon a common substrate that can be made of predominantly single crystalline silicon.

2. Description of Related Art

The following descriptions and examples are not admitted to be prior art by virtue of their inclusion within this section.

There are numerous types of memories available in the marketplace. For example, large volumes of data can be stored in magnetic memory, such as a hard disk drive. Lesser quantities of data can be stored in memory arranged upon an integrated circuit, oftentimes referred to as "semiconductor memory." Semiconductor memory is typically arranged closer to the core logic unit or execution unit than the hard disk drive and can be accessed much faster than the disk drive.

Common to semiconductor memory is a storage cell. Typically, storage cells are arranged in an array, with each cell adapted to receive a bit of data. The bit can be written (programmed) into the cell and the programmed bit can be read from the cell. In many instances, however, the bit can remain substantially indefinitely within the cell and may only be read from and not written into the cell. Thus, semiconductor memory can be classified as non-volatile memory or as read-only memory (ROM).

Depending on the application, semiconductor memory can either be volatile memory or non-volatile memory. Moreover, the memory can be either programmed in the field or programmed by the manufacturer. Regardless of the application, however, it is generally recognized that the number of memory cells is usually much greater than the number of logic gates within the core logic unit. This implies that the memory cost per bit must be kept very low in order to make the semiconductor memory economically feasible. One way to do so would be to make the memory device as small as possible.

While static RAMs and dynamic RAMs are generally classified as volatile memories, ROMs are designed as non-volatile memories. ROMs that are programmed by the manufacturer are typically known as masked ROMs. The category of ROMs that are programmed in the field include programmable ROM or PROM, erasable-programmable ROM or EPROM, or electrically-erased programmable ROM or EEPROM.

Most PROMs can only be programmed once, typically by blowing open an appropriate word-to-bit connection path. Conversely, EPROMs and EEPROMs can be programmed and reprogrammed multiple times. EPROMs are programmed by injecting hot electrons into, for example, a floating gate dielectrically spaced above the transistor channel. The injected electrons can thereafter be removed by irradiating the floating gate with ultraviolet light. One advantage of EPROMs is that each cell consists of only one transistor, allowing an EPROM semiconductor memory to be fabricated with significantly high densities. Unfortunately, however, an EPROM must be packaged in a relatively expensive ceramic package with a UV-transparent window. The amount of time needed to erase a programmed cell is also rather significant. Still further, the UV light source will erase the entire EPROM semiconductor device.

Rather than changing the entire device, EEPROMs were developed to enable a user to change one byte at a time. Most conventional EEPROMs implement a floating gate, similar to EPROMs, but use tunnel oxides in order to allow electrons to tunnel onto and from the floating gate. The tunneling process, referred to as Fowler-Nordheim tunneling, is advantageously reversible. While EEPROMs allow individual cells to be erased and programmed, EEPROMs require a select transistor in each cell. Otherwise, the high voltage applied to the drain of the selected cell during an erase cycle would also appear on the drain of the other, unselected cells in the same memory column. The requirement of a select transistor significantly decreases the density and increases the overall manufacturing cost of an EEPROM.

In order to overcome the size constraints of the byte-programmed EEPROM having two transistors per cell, flash EEPROM was developed. While the contents of all of the memory cells or a block of cells can be erased simultaneously as with EPROM, flash does not require a select transistor for each cell. Moreover, a flash memory cell can be erased much more rapidly than an EPROM.

Flash EEPROM typically implements Fowler-Nordheim tunneling to remove electrons programmed into the floating gate. The tunneling mechanism removes those electrons through the tunnel oxide and onto the drain region. However, instead of using Fowler-Nordheim tunneling, the floating gate is programmed by hot electron injection into the gate. Thus, a flash EEPROM can be programmed similar to EPROM, but is generally erased similar to a byte-erasable EEPROM.

The control and floating gates of a single transistor flash EEPROM cell is arranged in an array, with floating gates connected to word lines and the drain node connected to bit lines. More specifically, the drain nodes can be connected either in parallel or in series to the bit lines, depending on whether the array is configured as a NOR-type array or a NAND-type array. In a NOR-type array, the transistor connected to the common bit line is activated by a corresponding word line and the bit line will transition to a power supply, typically ground. Since the logic function is similar to a NOR gate, this arrangement is generally understood to be a NOR-type array or NOR flash in the present instance. Contrary to a NOR array arrangement, a NAND array is one where all transistors connected to the common bit line must be activated before the bit line will transition to the power supply, typically ground.

Conventional flash EEPROM semiconductor memory devices are implemented as either a NOR array or a NAND array. This is primarily due to the desired application. For example, the parallel-operation of a NOR array oftentimes dictates the NOR flash EEPROMs as having faster access time, but longer erasing and programming times. However, a NAND array can advantageously use the tunneling mechanism for both erasing and programming. This provides a much faster erasure and program times than NOR arrays. Thus, while access times are faster in a NOR array, NOR arrays are typically dedicated to applications which require minimal erasure and programming. For example, one such application would be to store the boot-up code of an execution unit. NAND arrays, however, due to their slower access time but faster program and erase times, are better suited for storing non-boot code used for data/file manipulation.

Partially due to the radically different applications in which a flash NOR array and a flash NAND array are slated, conventional flash memory devices implement the dissimilar arrays on separate and distinct integrated circuits. One circuit can be used during boot-up, for example, and the other circuit can be more readily erased and programmed during subsequent data/file manipulation. Moreover, because of the requirement for an internal interface and register indigenous to the flash NAND array, the interface is implemented only on the integrated circuit containing the NAND array. Since a NOR array does not require this interface, the integrated circuit containing the NOR array can simply include the row and column decoders without additional circuit overhead. Thus, the conventional flash EEPROM requires separate integrated circuits for the separate NOR and NAND arrays in order to make the flash EEPROM economically feasible.

SUMMARY OF THE INVENTION

The problems outlined above are in large part solved by an integrated circuit that embodies both a flash NAND array and a flash NOR array. The integrated circuit is, therefore, a semiconductor device that includes not only the NOR and NAND arrays, but also all interface circuitry needed to service the internal command and address registers of a NAND while maintaining the memory-mapped random access interface needed for a NOR array. The interface integrated onto the semiconductor device supports both NAND and NOR accesses and, specifically, contains the input/output interface needed to support read, program, and erase sequences of the NAND array.

The integrated flash NAND array interface not only recognizes addresses targeted for the NAND array, but also produces the read enable, write enable, command latch enable, and address latch enable signals for performing page read and write operations, as well as block erasures. The controller which performs the interface function is referred to as a page and block controller, and the interface which recognized an address targeted for the NAND array or NOR array is referred to as an address decoder. Data transferred to and from the array is temporarily stored in a data register, and the address of that data can be stored in an address register. Not only are the NAND and NOR arrays configured on the same integrated circuit, but the corresponding row/column decoders, address decoder, page and block controller, and data/address registers are also embodied on the same integrated circuit.

The semiconductor memory device having both the NOR array, NAND array, and supporting interface controllers is preferably a flash semiconductor device. Moreover, the flash semiconductor memory device preferably includes a single transistor for each memory cell, regardless of whether the cell is within the NOR array or the NAND array. The single transistor may include a single floating gate dielectrically spaced between the substrate and a corresponding control gate. The floating gate within the NOR array can be programmed by hot electron injection, whereas the floating gate in the NAND array can be programmed using a tunneling mechanism. In this fashion, the NAND array can maintain its relatively fast program and erase times, while also having the benefit of a denser layout arrangement. The added density of the NAND array is due to, primarily, the absence of a power supply conductor, such as ground, connected to each source node within the array. Space needed to route the power supply conductor and make contacts to all of the source nodes consumes significant real estate, which is avoided in the NAND array.

The present integrated circuit is thereby attuned to achieving fast access through the lower density NOR array, and slower access but faster program/erase times through the more dense NAND array. All such conceivable EEPROM activity can, therefore, be handled from a single integrated circuit, with the appropriate interface also arranged on that integrated circuit.

According to one embodiment, a semiconductor memory device is contemplated. The memory device includes a monolithic substrate and a NOR array of memory cells configured upon and within the substrate. A NAND array of memory cells is also configured upon and within the substrate. The NOR array includes a cell with a single transistor (i.e., single NOR transistor) having a source node coupled to a power supply, such as ground, and a drain node preferably coupled to a first bit line. The NAND array cell also includes a single transistor (i.e., single NAND transistor) having a source node coupled to a second bit line, and a drain node coupled to a source node of another NAND transistor within another cell of the NAND array.

According to yet another embodiment, the semiconductor memory device further includes an address decoder, a page and block controller, a data register, and NAND/NOR array row/column decoders. While the NOR array utilizes fully memory-mapped random access memory, similar to an EPROM, the NAND array row/column decoders transfer data from a memory bus to the array during different stages of transfer, depending on the status of the command latch enable signal, the address latch enable signal, the write enable signal, and the read enable signal produced from the page and block controller.

According to yet another embodiment, a method is provided for transferring data into and from an integrated circuit semiconductor memory device. The method includes decoding an address on a memory bus external to the semiconductor memory device as targeting either code stored in a NOR array of memory cells or in a NAND array of memory cells, both of which are configured upon the integrated circuit semiconductor memory device. A read, program, or erase command can also be decoded on the memory bus to perform a read operation, a program operation, or an erase operation on the NOR array if the decoding step produces a target in the NOR array of memory cells. If the decoding produces a target in the NAND array of memory cells, then the read, program, or erase command on the memory bus is converted to a read enable, write enable, command latch enable, or address latch enable command. Depending on the status of the read enable, write enable, command latch enable, and address latch enable, a read operation, a program operation, or an erase operation can be performed on pages or blocks of the NAND array of memory cells.

BRIEF DESCRIPTION OF THE DRAWINGS

Other objects and advantages of the invention will become apparent upon reading the following detailed description and upon reference to the accompanying drawings in which:

FIG. 1 is a partial circuit schematic of a NOR array of storage cells;

FIG. 2 is a partial circuit schematic of a NAND array of storage cells;

FIG. 3 is a block diagram of the NOR array and the NAND array of FIGS. 1 and 2 integrated upon a common substrate, with the NOR array controlled by row and column decoders, and with the NAND array controlled by row and column decoders as well as a page block controller with associated temporary data register storage; and FIG. 4 is a partial flow diagram of read, program and erase operations that occur within the decoders and the page/block controllers depending on whether the address received on the memory bus is targeted for the NOR array or the NAND array.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a flash NOR array 10 within an EEPROM semiconductor memory device. More specifically, array 10, for sake of brevity and clarity in the drawing, is illustrative of only three bit lines (BL0–2) and three word lines (WL0–2) of an array having significantly more than three bit lines and word lines. The portion shown includes an array of nine flash EEPROM cells. It is certainly understood that the array can include more than three bit lines, three word lines and nine flash EEPROM cells, depending on the desired memory storage capacity. Each cell constitutes a single transistor 12. Transistor 12 can be formed as a double polysilicon gate structure. The upper polysilicon gate is referred to as the control gate, and the lower polysilicon gate is referred to as the floating gate. The gate oxide can be approximately several nanometers thick and the inter-poly dielectric can be made of nitride/oxide composite film, for example. The floating gate of each transistor 12 preferably includes a much thinner tunnel oxide separating it from the upper surface of the semiconductor substrate. Programming the floating gate of transistor 12 is preferably carried out using hot electron injection, whereas erasure of the floating gate is preferably carried out through the tunneling oxide via the Fowler-Nordheim tunneling mechanism.

As shown in FIG. 1, each transistor 12 includes a drain node coupled to a corresponding bit line, and a source node coupled to a corresponding power supply, such as ground. The power supply conductor is routed and connected via a contact opening to each source node. While NOR array 10 enjoys much faster access times, the added space needed to route the power supply conductor and contact opening substantially reduces the density of NOR array 10.

Turning now to FIG. 2, a NAND array 20 is shown. For sake of brevity and clarity in the drawing, FIG. 2 illustrates only nine cells within possibly thousands of cells, each cell represented as a single transistor 22. Transistor 22, similar to transistor 12, can be a floating gate tunneling oxide transistor. The floating gate is dielectrically spaced between the control gate and the substrate. Preferably, a tunneling oxide can form a portion of the floating gate-to-substrate oxide. The tunneling oxide allows electrons to tunnel onto the floating gate during a program cycle. Thereafter, the tunneling process can be reversed by extracting the programmed electrons from the floating gate during an erase cycle.

Thus, NAND array 20 includes transistors 22 that are programmed and erased using the Fowler-Nordheim tunneling mechanism. This allows NAND array 20 to be programmed and erased much faster than the program and erase times of NOR array 10. While programming and erase features of NAND array 20 are faster and consume less power than NOR array 10, NAND array 20 nonetheless suffers from a slower access time. This is due, in part, to the NAND functionality of the transistor configuration. Instead of connecting each transistor in parallel to the corresponding bit line, transistors are connected in series to a bit line. This series connection deleteriously causes an increase in access time. As shown, the drain node of a transistor is connected to a source node of the neighboring transistor, and the combination of the drain and source node connection forms a bit line path. Importantly, the source and drain connection does not involve any further connection to a power supply conductor. This allows NAND array 20 to be far more dense in its configuration than NOR array 10. Thus, the manufacturing cost per bit is substantially reduced.

Flash NAND arrays are typically used to replace mass storage devices that are periodically read from and written to during the operation of an execution unit, for example. A flash NAND array consumes far less power than a magnetic hard disk drive and enjoys a must faster seek time than that of a hard disk. However, a flash array must be erased before reprogramming. In the case of continuous programming, where the seek time is negligibly small, a hard disk drive can be programmed more quickly than a flash NAND array. Nonetheless, flash NAND was designed to be similar in many respects to a hard disk drive—the memory in which it was originally intended to replace. As with hard disk drives, a NAND array requires reading and writing from sectors or pages of bytes. Multiple pages or a block of pages can be erased simultaneously. Since a NAND array does not have dedicated address and data lines as in a NOR array, a NAND array is controlled using an indirect input/output interface controller, similar to the sector controller in a hard disk drive. The controller conventionally resides in an integrated circuit separate and apart from the NAND integrated circuit. It is not readily apparent to a skilled artisan to combine the controller with the NAND array, and even less apparent to combine the controller with the NAND and NOR arrays. This is due primarily to the controller being indigenous only to the NAND array and, therefore, there would be impetus for using the controller on an integrated circuit having a NOR array.

One typically cannot use the NAND array to boot the basic input/output system (BIOS) requirements because of the indirect input/output interface requirement of a NAND array. If boot and subsequent look-up, character generation, and micro-control operations are to be implemented from the same semiconductor memory device, then the NOR and NAND arrays must be implemented on the same integrated circuit 30 as shown in FIG. 3. Integrated circuit 30 is shown having a NAND array 20 and a NOR array 10. Since the NOR array 10 maps directly, similar to an EPROM, with dedicated address lines and data lines, NOR array 10 includes row decoder 32 and column decoder 34. The row decoder receives an address placed onto a corresponding word line, and the column decoder receives data written to or read from the NOR array 10. No separate controller is needed for setting up the addressing and data transfer cycles, or for grouping the addressing data according to a page size, for example.

Contrary to NOR array 10, NAND array 20 includes not only row and column decoders 36 and 38, respectively, but also a page and block controller 40. Read and program operations take place on a page basis, while an erase operation takes place on a block basis. During a read operation, NAND array 20 must first examine command signals generated within controller 40. The corresponding command signals are: write enable (WE), read enable (RE), address latch enable (ALE), and command latch enable (CLE). The combination of CLE and ALE designate the various phases in which a page is read from NAND array 20. For example, a page read involves four phases: command phase, address phase, data transfer phase, and read-out phase.

During a command phase, a RE signal can be brought high; during an address phase, the address in which a page of memory is read is placed on the output of controller 40. During a subsequent data transfer phase, the corresponding data is read from array 20 and placed into a data register 42. Thereafter, during a read-out phase, the data from register 42 is brought back into the memory bus data lines. Similar to a page read, a page program operation also involves several phases, beginning with the command phase and ending with a program (write) phase depending on the status of the CLE, ALE, and WE signals. A block erase allows for a block of multiple pages, typically 32, to be erased in a single operation, beginning with a command phase, then an address phase and, finally, an erase phase.

Details of the different phases and the interface state machine for a flash NAND array is described in "NAND Flash Applications Design Guide," by Toshiba Corporation (herein incorporated by reference, and hereinafter referred to as "Toshiba"). Unlike the teachings of Toshiba, controller 40 is implemented within the same integrated circuit 30 as NAND array 20. Thus, glue logic and GPIO pins are not required for interfacing between a NAND array integrated circuit and the controller integrated circuit.

By implementing both the NAND and NOR arrays on a single integrated circuit, a distinction must be made between addresses targeted for the NAND array 20 and the NOR array 10. As the address is received by the memory bus, an address decoder 44 will determine if that address is targeted for NAND array 20 or NOR array 10. For example, BIOS boot code can be placed within a particular address range and, therefore, any addresses sent by the memory bus within that address range might trigger accesses to the NOR array, for example. If, however, the incoming addresses are within a range dedicated to the NAND array 20, then a select signal is sent from the address decoder to controller 40 to initiate the appropriate page read or write operations to NAND array 20, for example.

The blocks shown in FIG. 3 are preferably contained on a single semiconductor substrate. The substrate is a monolithic substrate and is preferably single crystal silicon or gallium arsenide. The substrate can be doped in multiple ways to produce the semiconductor features, and also contains patterned thin film placed upon the upper surface of the substrate to form an integrated circuit.

FIG. 4 illustrates the operation of addresses sent to address decoder 44 of FIG. 3. In particular, the addresses are examined 50 to determine whether the address is targeted for the NAND array or the NOR array. If the address is within the NOR target address range 52, then the read, program, and erase commands on the memory bus are examined 54. Depending on whether the command is a read, program, or erase command, the corresponding row is asserted in order to read 56, write 58, or erase 60 a byte of data within a corresponding column or columns.

If the address is within the NAND target address range 62, this will signify the need to examine 64 the RE/WE signals within the controller 40 (FIG. 3). If RE is asserted, then the ALE and CLE bits are examined 66 to determine the sequence of the address, transfer, and read-out phases. If WE is asserted, then ALE and CLE bits are examined 68 to determine the phases of a write operation. If neither RE or WE is asserted, then an erase operation ensues in order to erase an entire block of multiple pages of information. The progression by which data is transferred in a read operation begins by transferring data 70 from the array to the data register, and then from the data register to the memory bus. The progression of data transferred during a write operation begins by transferring data 72 from the memory bus to the data register, and then from the data register to the array. The data register thereby stores pages of information transferred to and from the array in order to move rather significant amounts of information representative of a page.

Various other modifications and alterations in the structure and method of operation of this invention will be apparent to those skilled in the art having the benefit of this disclosure. Although the invention has been described in connection with specific preferred embodiments, it should be understood that the invention as claimed should not be unduly limited to such specific embodiments. It is intended that the following claims define the scope of the present invention and that the structures and methods within the scope of these claims and their equivalents be covered thereby.

What is claimed is:

1. A semiconductor memory device, comprising:
   a monolithic substrate;
   a NOR array of memory cells configured upon and within the substrate, wherein each NOR array memory cell includes a single NOR transistor having a NOR transistor source node coupled to a power supply and a NOR transistor drain node coupled to a first bit line; and
   a NAND array of memory cells configured upon and within the substrate, wherein each NAND array memory cell includes a single NAND transistor having a NAND transistor source node coupled to a second bit line and a NAND transistor drain node coupled to a NAND transistor source node of another NAND transistor within another cell of the NAND array of memory cells.

2. The semiconductor memory device as recited in claim 1, wherein the monolithic substrate comprises single crystalline silicon.

3. The semiconductor memory device as recited in claim 1, wherein the monolithic substrate comprises gallium arsenide.

4. The semiconductor memory device as recited in claim 1, wherein the NOR array is configured upon a first portion of the monolithic substrate spaced from the NAND array configured upon a second portion of the monolithic substrate.

5. The semiconductor memory device as recited in claim 1, wherein the NOR transistor and the NAND transistor each comprise a floating gate.

6. The semiconductor memory device as recited in claim 5, wherein the floating gate is dielectrically spaced between the substrate and a corresponding control gate.

7. The semiconductor memory device as recited in claim 5, wherein the floating gate is adapted for receiving electrons during a time in which the floating gate is programmed.

8. The semiconductor memory device as recited in claim 1, further comprising:
   an address decoder;
   a NOR array row decoder;

a NOR array column decoder; and wherein the address decoder, the NOR array row decoder, and the NOR array column decoder are adapted for reading data from, programming data into and erasing data within the NOR array if an incoming address on a memory bus decoded by the address decoder is targeted for the NOR array.

9. The semiconductor memory device as recited in claim 8, wherein the address decoder, the NOR array row decoder and the NOR array column decoder are configured upon and within the substrate.

10. The semiconductor memory device as recited in claim 1, further comprising an address decoder;
a page and block controller;
a data register;
a NAND array row decoder;
a NAND array column decoder;
wherein the address decoder, the NAND array row decoder, and the NAND array column decoder are adapted for reading data from, programming data into and erasing data within the NAND array if an incoming address on a memory bus decoded by the address decoder is targeted for the NAND array; and
wherein the data register stores pages of data transferred between a memory bus and the NAND array during different stages of transfer depending on the status of a command latch enable (CLE) signal, an address latch enable (ALE) signal, a write enable (WE) signal, and a read enable (RE) signal produced from the page and block controller.

11. The semiconductor memory device as recited in claim 10, wherein the address decoder, the page and block controller, the data register, the NAND array row decoder and the NAND array column decoder are configured upon and within the substrate.

12. A semiconductor memory device, comprising:
a NOR array of memory cells;
a NOR array of row and column decoders for selecting at least one memory cell of the NOR array of memory cells;
a NAND array of memory cells;
a NAND array of row and column decoders for selecting a plurality of the NAND array of memory cells;
a page and block controller coupled to the NAND array row and column decoders for controlling the NAND array and column decoders;
an address decoder configured to receive an address from a memory bus and route the address to either (i) the NOR array row and column decoders or (ii) the page and block controller depending on whether the address is to information stored in the NOR array of memory cells or the NAND array of memory cells; and
wherein the NOR array of memory cells, the NOR array of row and column decoders, the NAND array of memory cells, the NAND array of row and column decoders, the page and block controller and the address decoder are configured as part of an integrated circuit.

13. The semiconductor memory device as recited in claim 12, wherein the integrated circuit is a semiconductor die.

14. The semiconductor memory device as recited in claim 12, wherein the at least one memory cell of the NOR array of memory cells is a byte of eight NOR array of memory cells.

15. The semiconductor memory device as recited in claim 12, further comprising a data register configured as part of the integrated circuit for receiving data transferred between a memory bus and the NAND array of memory cells during different stages of transfer depending on the status of a command latch enable (CLE) signal, an address latch enable (ALE) signal, a write enable (WE) signal, and a read enable (RE) signal produced from the page and block controller.

16. The semiconductor memory device as recited in claim 15, wherein the plurality of the NAND array of memory cells is a page of at least 528 bytes of eight NAND array of memory cells during times when the RE signal or WE signal is active.

17. The semiconductor memory device as recited in claim 16, wherein the plurality of NAND array of memory cells is a block of at least 32 pages during times when the RE signal and WE signal are inactive.

18. A method for transferring data into and from an integrated circuit semiconductor memory device, comprising:

decoding an address on a memory bus external to the semiconductor memory device as targeting either code stored in a NOR array of memory cells or in a NAND array of memory cells, both of which are configured upon the integrated circuit semiconductor memory device;

decoding a read, program or erase command on the memory bus to perform a read operation, a program operation or an erase operation on the NOR array if said decoding produces a target in the NOR array of memory cells; and converting a read, program or erase command on the memory bus to a read enable (RE), write enable (WE), command latch enable (CLE), and address latch enable (ALE) command and, depending on the status of RE, WE, CLE and ALE, performing a read operation, a program operation, or an erase operation on pages or blocks of the NAND array of memory cells.

19. The method as recited in claim 18, wherein said converting occurs within a page and block controller configured upon the integrated circuit semiconductor memory device.

20. The method as recited in claim 18, wherein said decoding the address comprises decoding an address range of boot code within the NOR array or look-up tables, character generators, or micro-control code within the NAND array.

* * * * *